US012586643B2

(12) United States Patent
Tseng et al.

(10) Patent No.: US 12,586,643 B2
(45) Date of Patent: Mar. 24, 2026

(54) MEMORY DEVICE AND OPERATING METHOD THEREOF

(71) Applicant: MACRONIX INTERNATIONAL CO., LTD., Hsinchu (TW)

(72) Inventors: Po-Hao Tseng, Taichung (TW);
Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 96 days.

(21) Appl. No.: 18/672,190

(22) Filed: May 23, 2024

(65) Prior Publication Data

US 2025/0232811 A1      Jul. 17, 2025

Related U.S. Application Data

(60) Provisional application No. 63/621,129, filed on Jan. 16, 2024.

(51) Int. Cl.
| | |
|---|---|
| *G11C 15/04* | (2006.01) |
| *G11C 16/04* | (2006.01) |
| *H10B 43/30* | (2023.01) |

(52) U.S. Cl.
CPC ........ *G11C 15/046* (2013.01); *G11C 16/0466* (2013.01); *H10B 43/30* (2023.02)

(58) Field of Classification Search
CPC .... G11C 15/046; G11C 16/0466; H10B 43/30
(Continued)

(56) References Cited

U.S. PATENT DOCUMENTS

| | | | | |
|---|---|---|---|---|
| 7,916,551 B2 * | 3/2011 | Tsai | ........ | G11C 16/10 |
| | | | | 365/185.28 |
| 2007/0087482 A1 * | 4/2007 | Yeh | ........ | B82Y 10/00 |
| | | | | 257/E21.21 |

(Continued)

FOREIGN PATENT DOCUMENTS

| | | |
|---|---|---|
| CN | 111341365 B | 2/2022 |
| CN | 115273924 A | 11/2022 |

(Continued)

OTHER PUBLICATIONS

T. Krishnamohan et al., "Double-Gate Strained-Ge Heterostructure Tunneling FET (TFET) With Record High Drive Currents and <60mV/dec Subthreshold Slope," 2008 IEEE International Electron Devices Meeting, San Francisco, CA,. Usa, 2008, pp. 947-949.

*Primary Examiner* — Ly D Pham
(74) *Attorney, Agent, or Firm* — McClure, Qualey & Rodack, LLP

(57) ABSTRACT

A memory device includes a first memory cell including channel, source and drain structures and a charge trap layer. When a first data bit has a first logic value and a voltage signal applied to the charge trap layer has a first voltage level, a current signal flowing through the channel structure has a first current level. When the first data bit has the first logic value and the voltage signal has a second voltage level, the current signal has a second current level. When the first data bit has a second logic value and the voltage signal has the first voltage level, the current signal has the second current level. When the first data bit has the second logic value and the voltage signal has the second voltage level, the current signal has the first current level.

20 Claims, 13 Drawing Sheets

(58) Field of Classification Search
USPC ...................................................... 365/49.17
See application file for complete search history.

(56) References Cited

U.S. PATENT DOCUMENTS

| | | | | |
|---|---|---|---|---|
| 2008/0080238 A1* | 4/2008 | Yuda | ................... | H10D 64/037 |
| | | | | 438/257 |
| 2010/0254194 A1* | 10/2010 | Chou | ................. | G11C 16/0475 |
| | | | | 365/185.21 |
| 2016/0172037 A1 | 6/2016 | Lee | | |
| 2023/0110738 A1* | 4/2023 | Shlomo | ............... | G11C 11/5671 |
| | | | | 365/185.2 |
| 2023/0207022 A1* | 6/2023 | Lu | ....................... | G11C 11/1677 |
| | | | | 365/185.17 |
| 2023/0337436 A1 | 10/2023 | Lin | | |
| 2025/0037783 A1* | 1/2025 | Prakash | ............... | G11C 29/028 |

FOREIGN PATENT DOCUMENTS

| | | | |
|---|---|---|---|
| CN | 115641893 A | 1/2023 |
| TW | 202145441 A | 12/2021 |
| TW | I763266 B | 5/2022 |

* cited by examiner

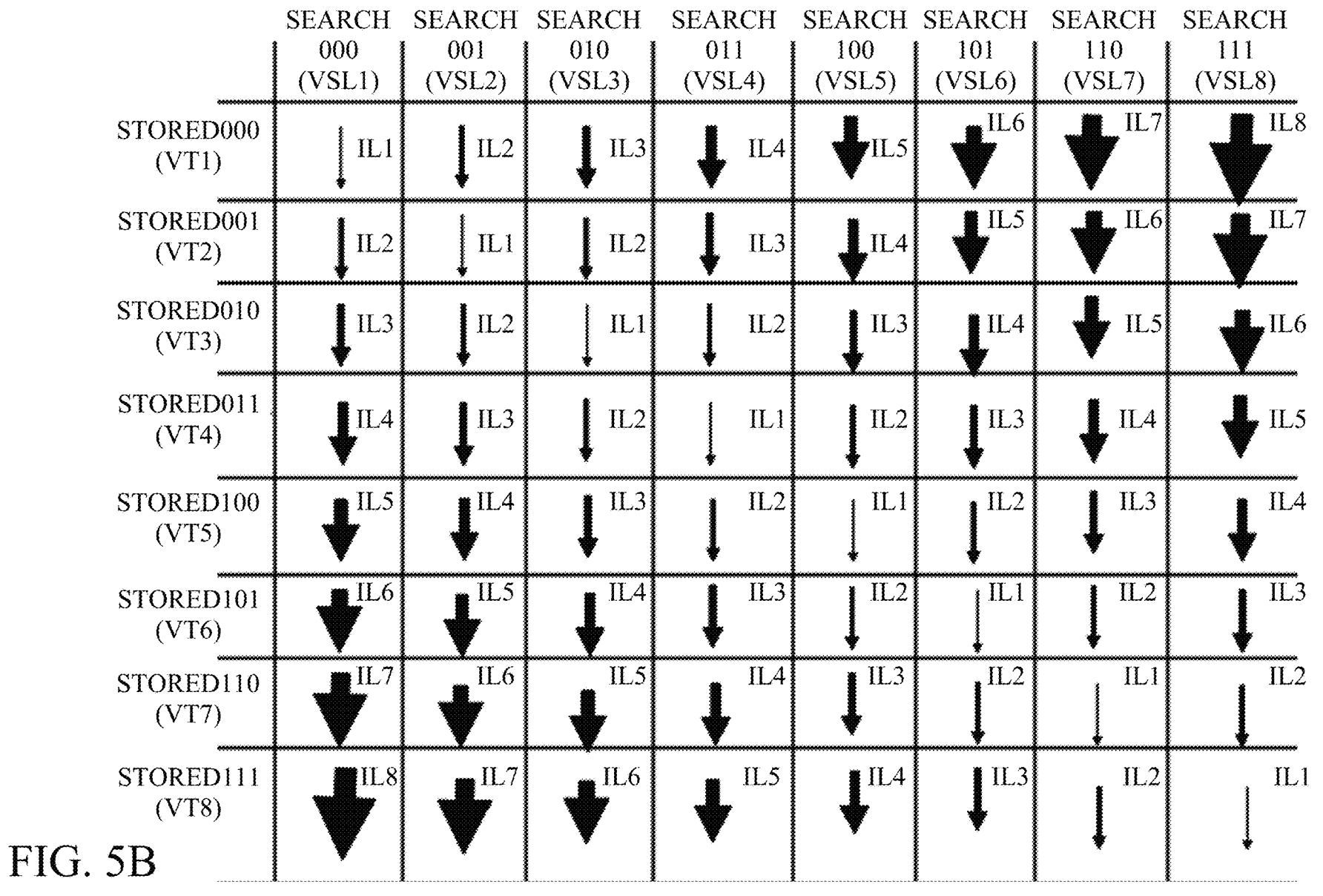

| | SEARCH 000 (VSL1) | SEARCH 001 (VSL2) | SEARCH 010 (VSL3) | SEARCH 011 (VSL4) | SEARCH 100 (VSL5) | SEARCH 101 (VSL6) | SEARCH 110 (VSL7) | SEARCH 111 (VSL8) |
|---|---|---|---|---|---|---|---|---|
| STORED000 (VT1) | IL1 → | IL2 → | IL3 → | IL4 → | IL5 → | IL6 → | IL7 → | IL8 → |
| STORED001 (VT2) | IL2 → | IL1 → | IL2 → | IL3 → | IL4 → | IL5 → | IL6 → | IL7 → |
| STORED010 (VT3) | IL3 → | IL2 → | IL1 → | IL2 → | IL3 → | IL4 → | IL5 → | IL6 → |
| STORED011 (VT4) | IL4 → | IL3 → | IL2 → | IL1 → | IL2 → | IL3 → | IL4 → | IL5 → |
| STORED100 (VT5) | IL5 → | IL4 → | IL3 → | IL2 → | IL1 → | IL2 → | IL3 → | IL4 → |
| STORED101 (VT6) | IL6 → | IL5 → | IL4 → | IL3 → | IL2 → | IL1 → | IL2 → | IL3 → |
| STORED110 (VT7) | IL7 → | IL6 → | IL5 → | IL4 → | IL3 → | IL2 → | IL1 → | IL2 → |
| STORED111 (VT8) | IL8 → | IL7 → | IL6 → | IL5 → | IL4 → | IL3 → | IL2 → | IL1 → |

FIG. 5B

MEMORY DEVICE AND OPERATING METHOD THEREOF

CROSS-REFERENCE TO RELATED APPLICATION

This application claims priority to U.S. Provisional Application Ser. No. 63/621,129, filed Jan. 16, 2024, which is herein incorporated by reference in its entirety.

BACKGROUND

Technical Field

The present disclosure relates to a memory technique. More particularly, the present disclosure relates to a memory device and an operating method of a memory device.

Description of Related Art

A memory device can perform database searches, in-memory data processing and neuromorphic computing by ternary content addressable memory (TCAM). However, in architecture of static random-access memory (SRAM), multiple transistors are required to form a single TCAM cell. As a result, required area is larger and power consumption is higher. Thus, techniques associated with the designing for overcoming the problems described above are important issues in the field.

SUMMARY

The present disclosure provides a memory device. The memory device includes a first memory cell configured to store a first data bit. The first memory cell includes a channel structure, a source structure, a drain structure and a charge trap layer. The source structure contacts a first side of the channel structure. The drain structure contacts a second side of the channel structure. The charge trap layer contacts a third side of the channel structure. When the first data bit has a first logic value and a voltage signal applied to the charge trap layer has a first voltage level, a current signal flowing through the channel structure has a first current level. When the first data bit has the first logic value and the voltage signal has a second voltage level different from the first voltage level, the current signal has a second current level different from the first current level. When the first data bit has a second logic value different from the first logic value and the voltage signal has the first voltage level, the current signal has the second current level. When the first data bit has the second logic value and the voltage signal has the second voltage level, the current signal has the first current level.

In some embodiment, the memory device further includes a top electrode. The top electrode configured to apply the voltage signal to the charge trap layer. Along a first direction, the charge trap layer is located between the top electrode and the channel structure.

In some embodiment, along a second direction perpendicular with the first direction, the first side is opposite to the second side.

In some embodiment, when the channel structure has a first device length, in response to the voltage signal having a first search voltage level, a current level of the current signal is larger than a mismatch current level, when the channel structure has a second device length, in response to the voltage signal having the first search voltage level, the current level of the current signal is smaller than a match current level, the first device length is smaller than the second device length, and the match current level is smaller than mismatch current level.

In some embodiment, when the channel structure has the first device length, in response to the voltage signal having a second search voltage level, the current level of the current signal is equal to the match current level, and when the channel structure has the second device length, in response to the voltage signal having the second search voltage level, the current level of the current signal is smaller than the match current level.

In some embodiment, when the channel structure has the first device length, in response to the voltage signal having a third search voltage level, the current level of the current signal is larger than to the mismatch current level, and when the channel structure has the second device length, in response to the voltage signal having the third search voltage level, the current level of the current signal is equal to the mismatch current level.

In some embodiment, when a drain bias signal applied to the drain structure has a first drain bias level, in response to the voltage signal having a first search voltage level, a current level of the current signal is larger than a mismatch current level, when the drain bias signal has a second drain bias level, in response to the voltage signal having the first search voltage level, the current level of the current signal is smaller than a match current level, the first drain bias level is smaller than the second drain bias level, and the match current level is smaller than mismatch current level.

In some embodiment, when the drain bias signal has the first drain bias level, in response to the voltage signal having a second search voltage level, the current level of the current signal is equal to the match current level, and when the drain bias signal has the second drain bias level, in response to the voltage signal having the second search voltage level, the current level of the current signal is smaller than the match current level.

In some embodiment, when the drain bias signal has the first drain bias level, in response to the voltage signal having a third search voltage level, the current level of the current signal is larger than to the mismatch current level, and when the drain bias signal has the second drain bias level, in response to the voltage signal having the third search voltage level, the current level of the current signal is equal to the mismatch current level.

The present disclosure provides an operating method of a memory device. The operating method includes: storing a first data bit in a first memory cell; applying a voltage signal carrying a first search bit to the first memory cell; comparing first data bit and the first search bit to generate a current signal flowing through the first memory cell, in which when each of the first data bit and the first search bit has a first logic value, the current signal has a first current level, when the first data bit has the first logic value and the first search bit has a second logic value, the current signal has a second current level larger than the first current level, when the first data bit has the first logic value and the first search bit has a third logic value different from the second logic value, the current signal has the second current level, and a difference between the first logic value and the second logic value is equal to a difference between the third logic value and the first logic value.

In some embodiment, when the first data bit has the second logic value and the first search bit has the second logic value, the current signal has the first current level.

In some embodiment, when the first data bit has the third logic value and the first search bit has the third logic value, the current signal has the first current level.

In some embodiment, when the first data bit has the second logic value and the first search bit has the third logic value, the current signal has a third current level larger than the second current level.

In some embodiment, when the first data bit has the third logic value and the first search bit has the second logic value, the current signal has the third current level.

In some embodiment, when the first data bit has a fourth logic value and the first search bit has the second logic value, the current signal has a fourth current level larger than the third current level, and the fourth logic value is larger than the third logic value.

In some embodiment, when the first data bit has a second logic value and the first search bit has the fourth logic value, the current signal has the fourth current level.

In some embodiment, when the first data bit has a fourth logic value and the first search bit has the fourth logic value, the current signal has the first current level.

The present disclosure provides an operating method of a memory device. The operating method includes: setting a first threshold voltage of a first memory cell to store a first data bit in the first memory cell; applying a voltage signal carrying a first search bit to the first memory cell; and generating a current signal according to the first search bit and the first threshold voltage, in which the first data bit has a first logic value when the first threshold voltage has a first threshold voltage level, the first data bit has a second logic value different from the first logic value when the first threshold voltage has a second threshold voltage level, when each of the first data bit and the first search bit has the first logic value, the current signal has a first current level, when the first data bit has the second logic value and the first search bit has the first logic value the current signal has a second current level larger than the first current level, and when the first threshold voltage has a third threshold voltage level between the first threshold voltage level and the second threshold voltage level, the current signal has the first current level.

In some embodiment, when each of the first data bit and the first search bit has the second logic value, the current signal has the first current level.

In some embodiment, when the first data bit has the first logic value and the first search bit has the second logic value, the current signal has the second current level.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5B is a schematic diagram of various conditions of the memory cell performing the search operation, illustrated according to some embodiments of present disclosure.

DETAILED DESCRIPTION

Figure 1:
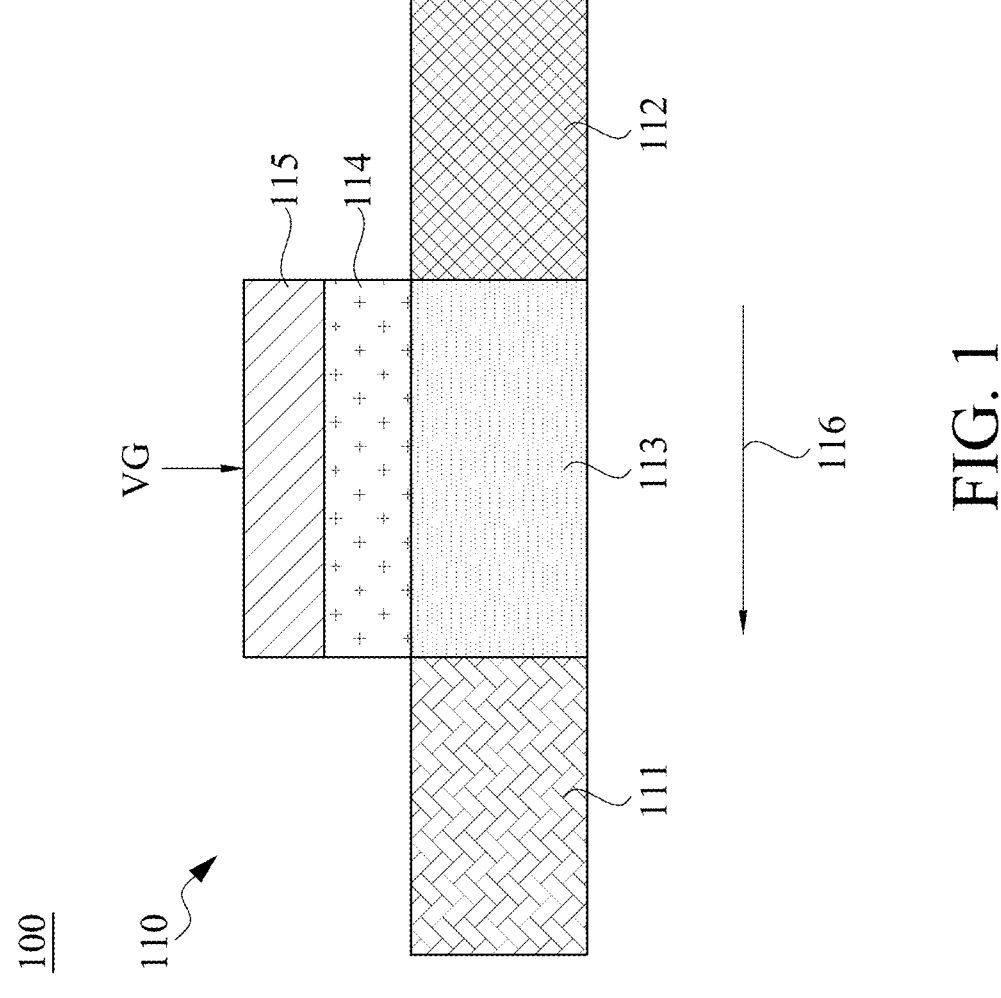
FIG. 1 is a schematic diagram of a part of a memory device illustrated according to some embodiments of present disclosure.

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1 is a schematic diagram of a part of a memory device 100 illustrated according to some embodiments of present disclosure. The memory device 100 includes a memory cell 110. In various embodiments, the memory device 100 can includes various numbers of memory cells.

As shown in FIG. 1, the memory device 100 includes a source structure 111, a drain structure 112, a channel structure 113, a charge trap layer 114 and a top electrode 115. Along the horizontal direction, the source structure 111 contacts a side of the channel structure 113, and the drain structure 112 contacts another side of the channel structure 113. Along the vertical direction, the charge trap layer 114 is located above the channel structure 113 and contacts the channel structure 113, and the top electrode 115 is located above the charge trap layer 114 and contacts the charge trap layer 114. In some embodiments, along the horizontal direction, a length of the charge trap layer 114 is approximately equal to a length of the channel structure 113.

In some embodiments, the source structure 111 can be formed by P-rich type material. The drain structure 112 can be formed by N-rich type material. The channel structure 113 can be formed by intrinsic silicon, intrinsic poly silicon or other intrinsic channel material. The charge trap layer 114 can be formed by nitride (such as oxide-nitride-oxide (ONO)) or other charge trap material (such as ferroelectric layer). The top electrode 115 can be formed by conductor (such as metal). In some embodiments, the memory cell 110 can be implemented by silicon-oxide-nitride-oxide-silicon (SONOS) tunneling field effect transistors (TFET).

In some embodiments, the charge trap layer 114 can store charges. In response to different charge quantities in the charge trap layer 114, the memory cell 110 has different threshold voltage levels. With the different threshold voltage levels, the memory cell 110 can correspond to different logic values of a data bit DT1. Alternatively stated, the memory cell 110 stores the logic value of the data bit DT1 by the charge trap layer 114.

In some embodiments, the top electrode 115 is configured to receive a voltage signal VG, and applies the voltage signal VG to the charge trap layer 114. The voltage signal VG can carry a search bit SB1. When the search operation is performed, the memory cell 110 generates a current signal 116 flowing through the memory cell 110 according to the voltage signal VG and the threshold voltage level of the memory cell 110. Alternatively stated, a current level of the current signal 116 corresponds to a match result of the search bit SB1 and the data bit DT1. In some embodiments, the current signal 116 is referred to as a match current signal.

In some approaches, the memory device performs database searches, in-memory data processing and neuromorphic computing by ternary content addressable memory (TCAM). However, in architecture of static random-access memory (SRAM), multiple transistors are required to form a single TCAM cell. As a result, required area is larger and power consumption is higher.

Compared to the approaches described above, in some embodiments of present disclosure, the memory cell 110 is implemented by SONOS TFET to perform in-memory computing, such that one TFET is used to form the memory cell 110. Accordingly, area efficiency is higher and power consumption is lower.

Figure 2A:
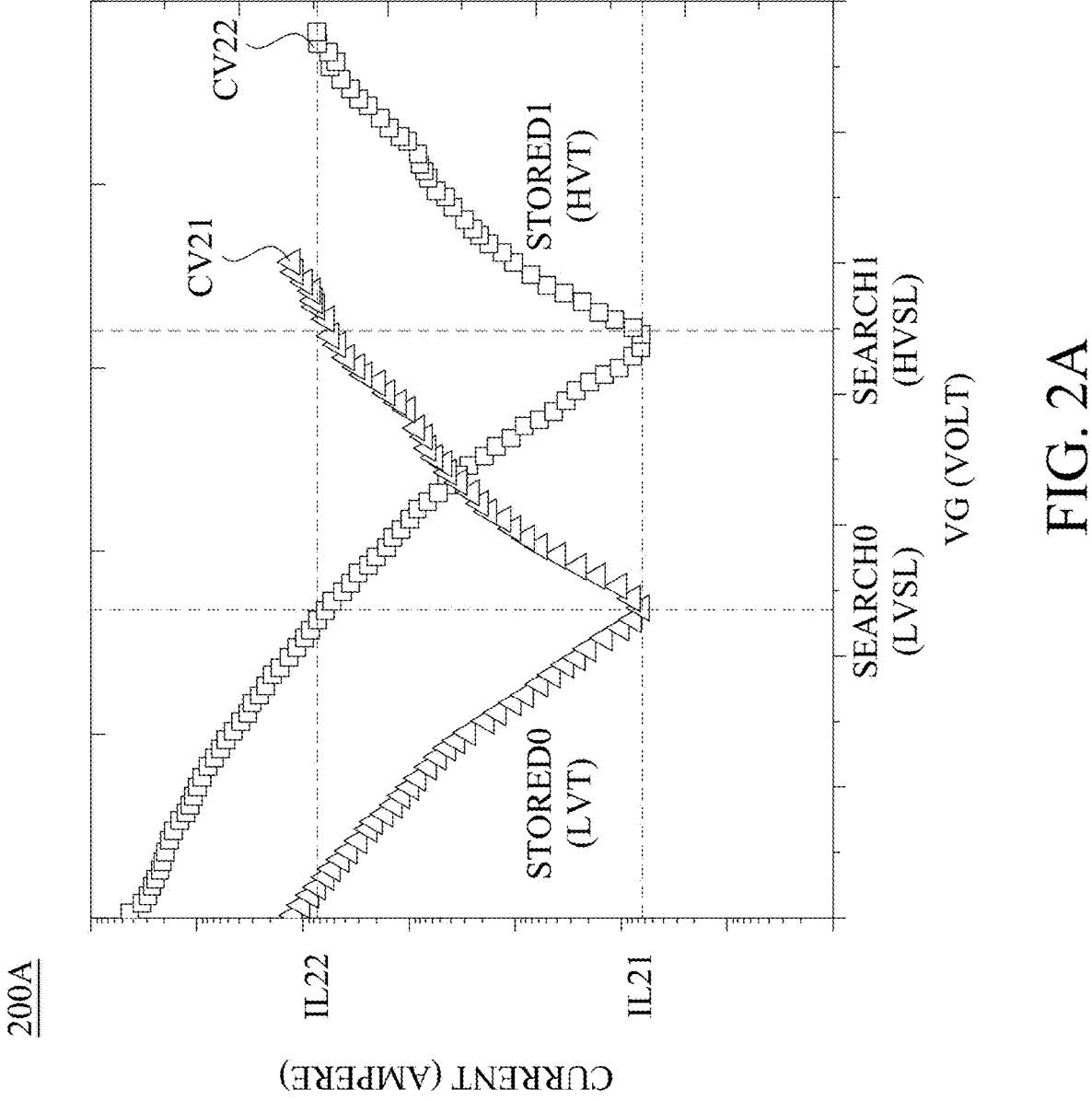
FIG. 2A is a relationship diagram of the current signal and the voltage signal illustrated according to some embodiments of present disclosure.

FIG. 2A is a relationship diagram 200A of the current signal 116 and the voltage signal VG illustrated according to some embodiments of present disclosure. A horizontal axis of the relationship diagram 200A represents voltage levels of the voltage signal VG. A vertical axis of the relationship diagram 200A represents current levels of the current signal 116, and is represented with log scale.

As shown in FIG. 2A, the relationship diagram 200A includes curves CV21-CV22. The curves CV21-CV22 represent two states of the memory cell 110 corresponding to the current signal 116. In the state corresponding to the curve CV21, the data bit DT1 stored by the memory cell 110 has the logic value 0. In the state corresponding to the curve CV22, the data bit DT1 stored by the memory cell 110 has the logic value 1.

In some embodiments, when the search bit SB1 has the logic value 0, the voltage signal VG has a voltage level LVSL. Correspondingly, the curves CV21 and CV22 have current levels IL21 and IL22, respectively. When the search bit SB1 has the logic value 1, the voltage signal VG has a voltage level HVSL. Correspondingly, the curves CV21 and CV22 have the current levels IL22 and IL21, respectively. In some embodiments, the current level IL22 is larger than the current level IL21.

Figure 2B:
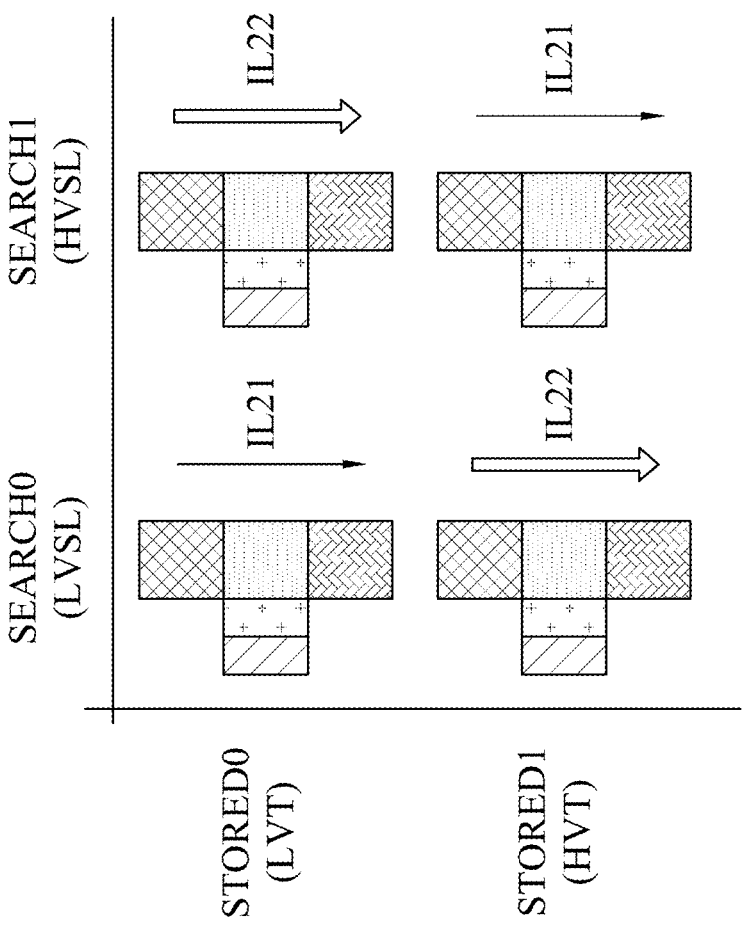
FIG. 2B is a schematic diagram of various conditions of the memory cell performing the search operation, illustrated according to some embodiments of present disclosure.

FIG. 2B is a schematic diagram of various conditions of the memory cell 110 performing the search operation, illustrated according to some embodiments of present disclosure. During the search operation, the memory cell 110 can compare the logic value of the stored data bit DT1 and the logic value of the search bit SB1 carried by the voltage signal VG, to generate the corresponding current signal 116. As shown in FIG. 2B, the memory cell 110 can operate in four conditions. The four conditions are arranged in two columns and two rows.

In the conditions of the first column, the search bit SB1 has the logic value 0, such that the voltage signal VG has the voltage level LVSL. In the conditions of the second column, the search bit SB1 has the logic value 1, such that the voltage signal VG has the voltage level HVSL.

In some embodiments, the threshold voltage of the memory cell 110 can be set to store the data bit DT1 in the memory cell 110. In the conditions of the first row, the data bit DT1 has the logic value 0, such that the memory cell 110 has the threshold voltage level LVT. In the conditions of the second row, the data bit DT1 has the logic value 1, such that the memory cell 110 has the threshold voltage level HVT. In some embodiments, the threshold voltage level HVT is larger than the threshold voltage level LVT.

In some embodiments, the charge quantity in the charge trap layer 114 is proportional to the threshold voltage level of the memory cell 110. Alternatively stated, for the charge trap layer 114, the charge quantity in the conditions of the first row is smaller than the charge quantity in the conditions of the second row.

As shown in FIG. 2B, in the condition of the first column and the second row, and the condition of the second column and the first row, in response to the logic values of the data bit DT1 and the search bit SB1 being different, the current signal 116 has the current level IL21. In the condition of the first column and the first row, and the condition of the second column and the second row, in response to the logic values of the data bit DT1 and the search bit SB1 being the same, the current signal 116 has the current level IL22. In some embodiments, the operation of the memory cell 110 is referred to as XNOR logic function.

Figure 3A:
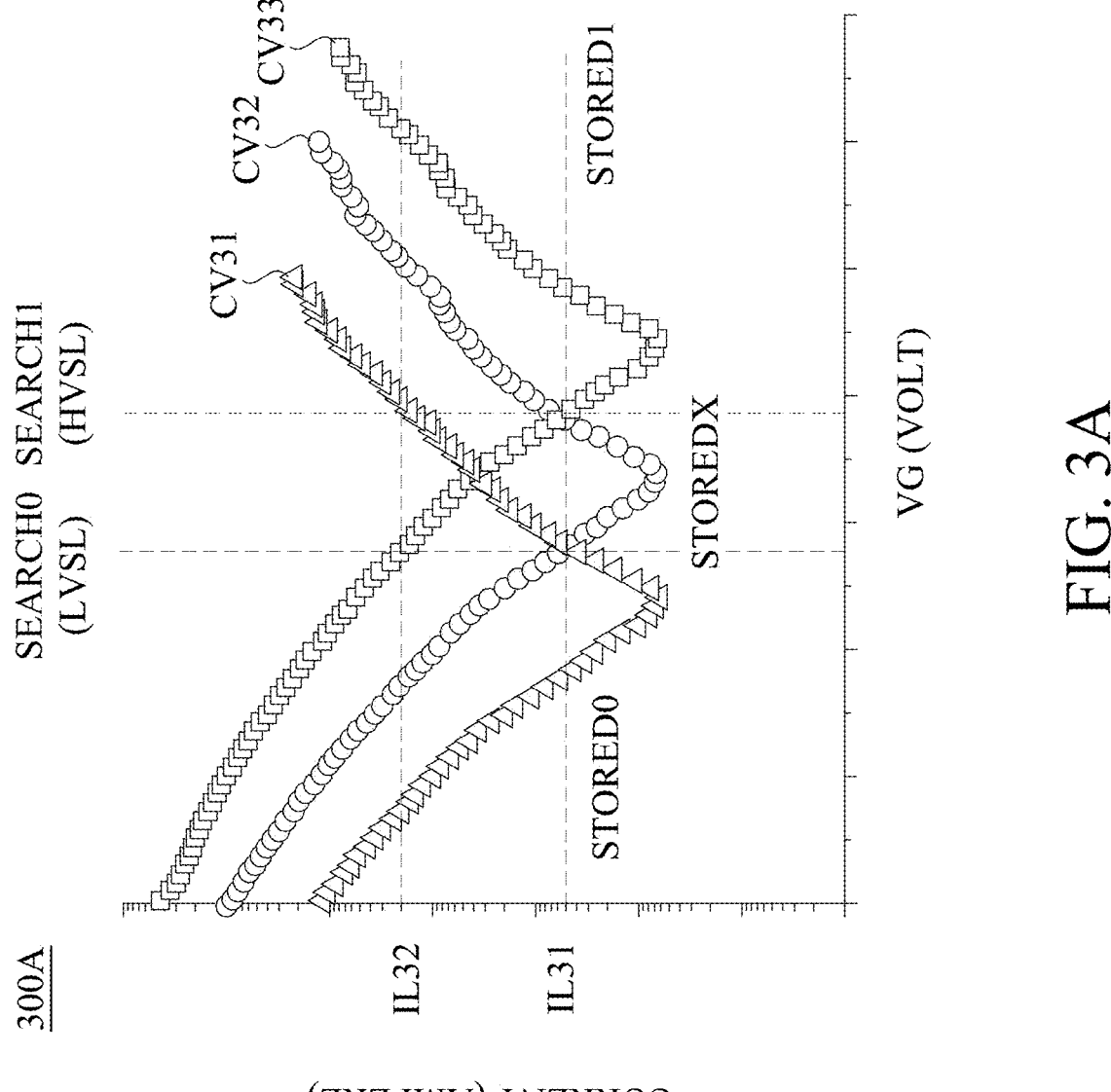
FIG. 3A is a relationship diagram of the current signal and the voltage signal illustrated according to some embodiments of present disclosure.

FIG. 3A is a relationship diagram 300A of the current signal 116 and the voltage signal VG illustrated according to some embodiments of present disclosure. A horizontal axis of the relationship diagram 300A represents voltage levels of the voltage signal VG. A vertical axis of the relationship diagram 300A represents current levels of the current signal 116, and is represented with log scale.

As shown in FIG. 3A, the relationship diagram 300A includes curves CV31-CV33. The curves CV31-CV33 represent three states of the memory cell 110 corresponding to the current signal 116. In the state corresponding to the curve CV31, the data bit DT1 stored by the memory cell 110 has the logic value 0. In the state corresponding to the curve CV32, the data bit DT1 stored by the memory cell 110 has the logic value X. In the state corresponding to the curve CV33, the data bit DT1 stored by the memory cell 110 has the logic value 1.

In some embodiments, the logic value X represents "don't care" logic value. During the search operation, the logic value X can correspond to any of the logic value 0 and the logic value 1.

As shown in FIG. 3A, when voltage signal VG has the voltage level LVSL, each of the curves CV31 and CV32 has a current level IL31, and the curve CV33 has a current level IL32. When voltage signal VG has the voltage level HVSL, each of the curves CV33 and CV32 has a current level IL31, and the curve CV31 has a current level IL32. In some embodiments, the current level IL32 is larger than the current level IL31. In some embodiments, the voltage levels LVSL and HVSL are 1.4 volt and 1.9 volt, respectively.

Figure 3B:
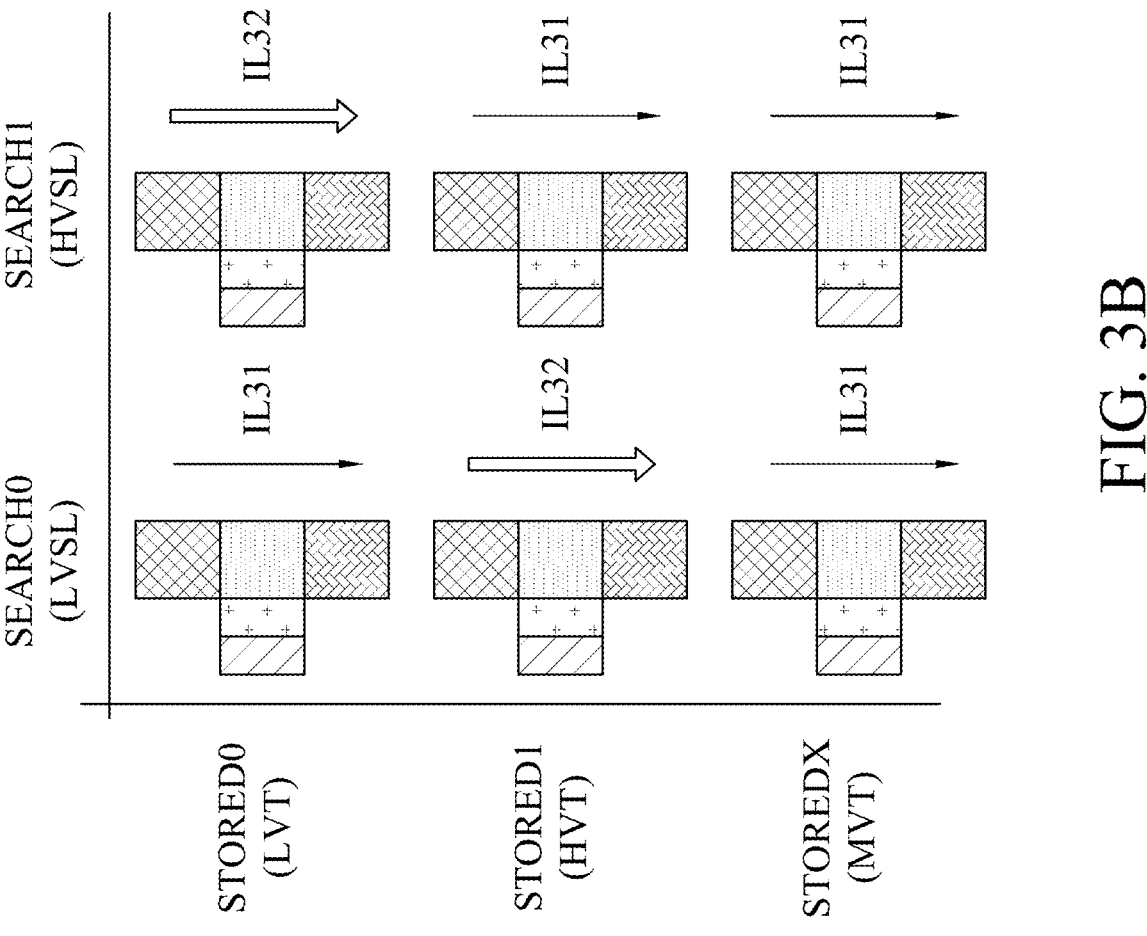
FIG. 3B is a schematic diagram of various conditions of the memory cell performing the search operation, illustrated according to some embodiments of present disclosure.

FIG. 3B is a schematic diagram of various conditions of the memory cell 110 performing the search operation, illustrated according to some embodiments of present disclosure. As shown in FIG. 3B, the memory cell 110 can operate in six conditions. The six conditions are arranged in two columns and three rows.

In the conditions of the first column, the search bit SB1 has the logic value 0, such that the voltage signal VG has the voltage level LVSL. In the conditions of the second column, the search bit SB1 has the logic value 1, such that the voltage signal VG has the voltage level HVSL.

In the conditions of the first row, the data bit DT1 has the logic value 0, such that the memory cell 110 has the threshold voltage level LVT. In the conditions of the second row, the data bit DT1 has the logic value 1, such that the memory cell 110 has the threshold voltage level HVT. In the conditions of the third row, the data bit DT1 has the logic value X, such that the memory cell 110 has the threshold voltage level MVT. In some embodiments, the threshold voltage level MVT is larger than the threshold voltage level LVT and is smaller than the threshold voltage level HVT.

As shown in FIG. 3B, in the condition of the first column and the second row, and the condition of the second column and the first row, in response to the logic values of the data bit DT1 and the search bit SB1 being different, the current signal 116 has the current level IL31. In the conditions of the first column and the first row, of the second column and the second row, and of the third row, in response to the logic values of the data bit DT1 and the search bit SB1 being the same, the current signal 116 has the current level IL32.

Figure 4A:
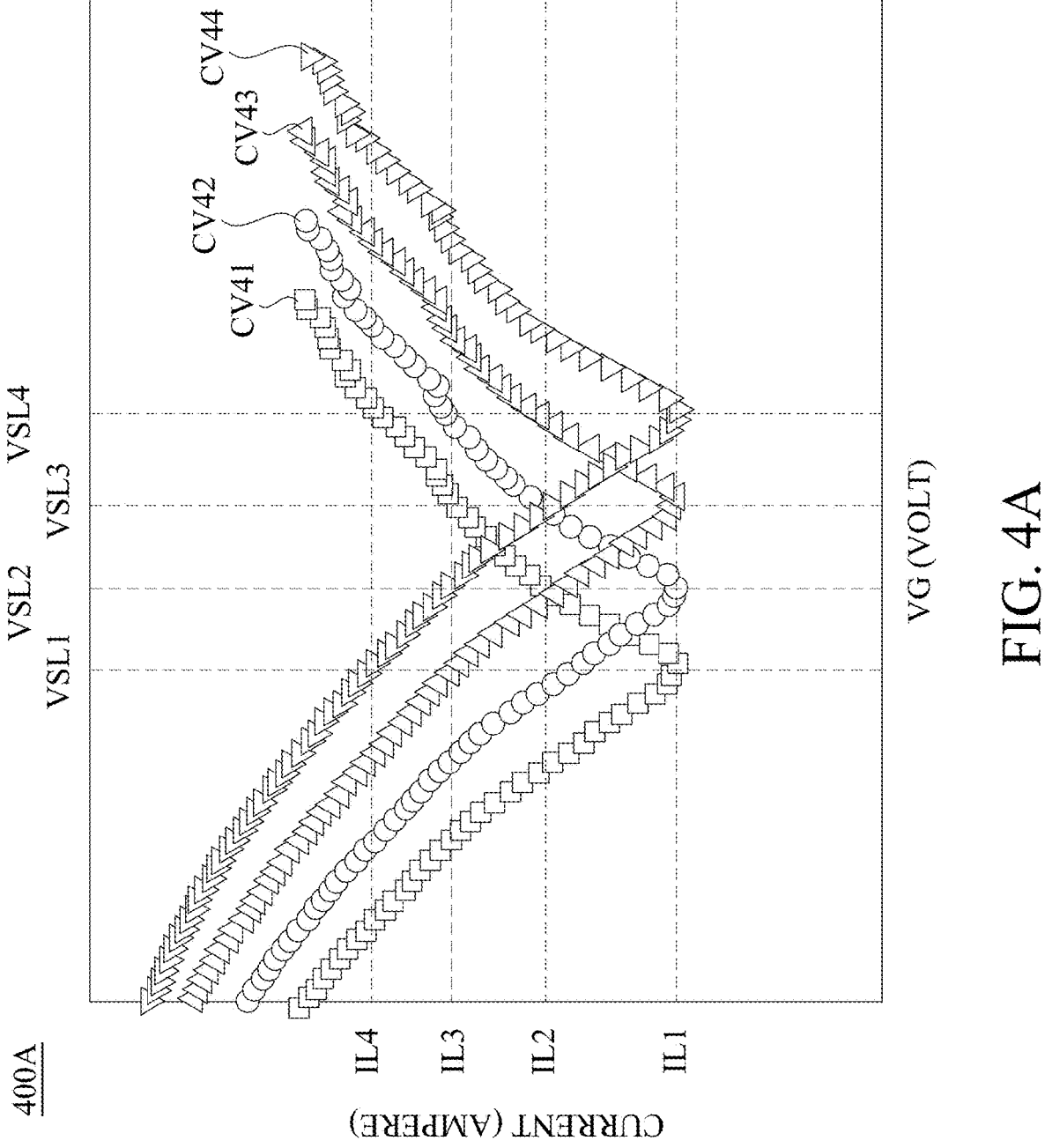
FIG. 4A is a relationship diagram of the current signal and the voltage signal illustrated according to some embodiments of present disclosure.

FIG. 4A is a relationship diagram 400A of the current signal 116 and the voltage signal VG illustrated according to some embodiments of present disclosure. A horizontal axis of the relationship diagram 400A represents voltage levels of the voltage signal VG. A vertical axis of the relationship diagram 400A represents current levels of the current signal 116, and is represented with log scale.

As shown in FIG. 4A, the relationship diagram 400A includes curves CV41-CV44. The curves CV41-CV44 represent four states of the memory cell 110 corresponding to the current signal 116. In the state corresponding to the curve CV41, the data bit DT1 stored by the memory cell 110 has the logic value 00. In the state corresponding to the curve CV42, the data bit DT1 stored by the memory cell 110 has the logic value 01. In the state corresponding to the curve CV43, the data bit DT1 stored by the memory cell 110 has the logic value 10. In the state corresponding to the curve CV44, the data bit DT1 stored by the memory cell 110 has the logic value 11. In decimal representation, the logic values 00, 01, 10 and 11 described above correspond to logic values 0, 1, 2 and 3, respectively.

As shown in FIG. 4A, when voltage signal VG has the voltage level VSL1, the curves CV41-CV44 has current levels IL1-IL4, respectively. When voltage signal VG has the voltage level VSL2, the curves CV41-CV44 has current levels IL2, IL1, IL2 and IL3, respectively. When voltage signal VG has the voltage level VSL3, the curves CV41-CV44 has current levels IL3, IL2, IL1 and IL2, respectively. When voltage signal VG has the voltage level VSL4, the curves CV41-CV44 has current levels IL4, IL3, IL2 and IL1, respectively.

In some embodiments, the current level IL4 is larger than the current level IL3, the current level IL3 is larger than the current level IL2, and the current level IL2 is larger than the current level IL1.

Figure 4B:
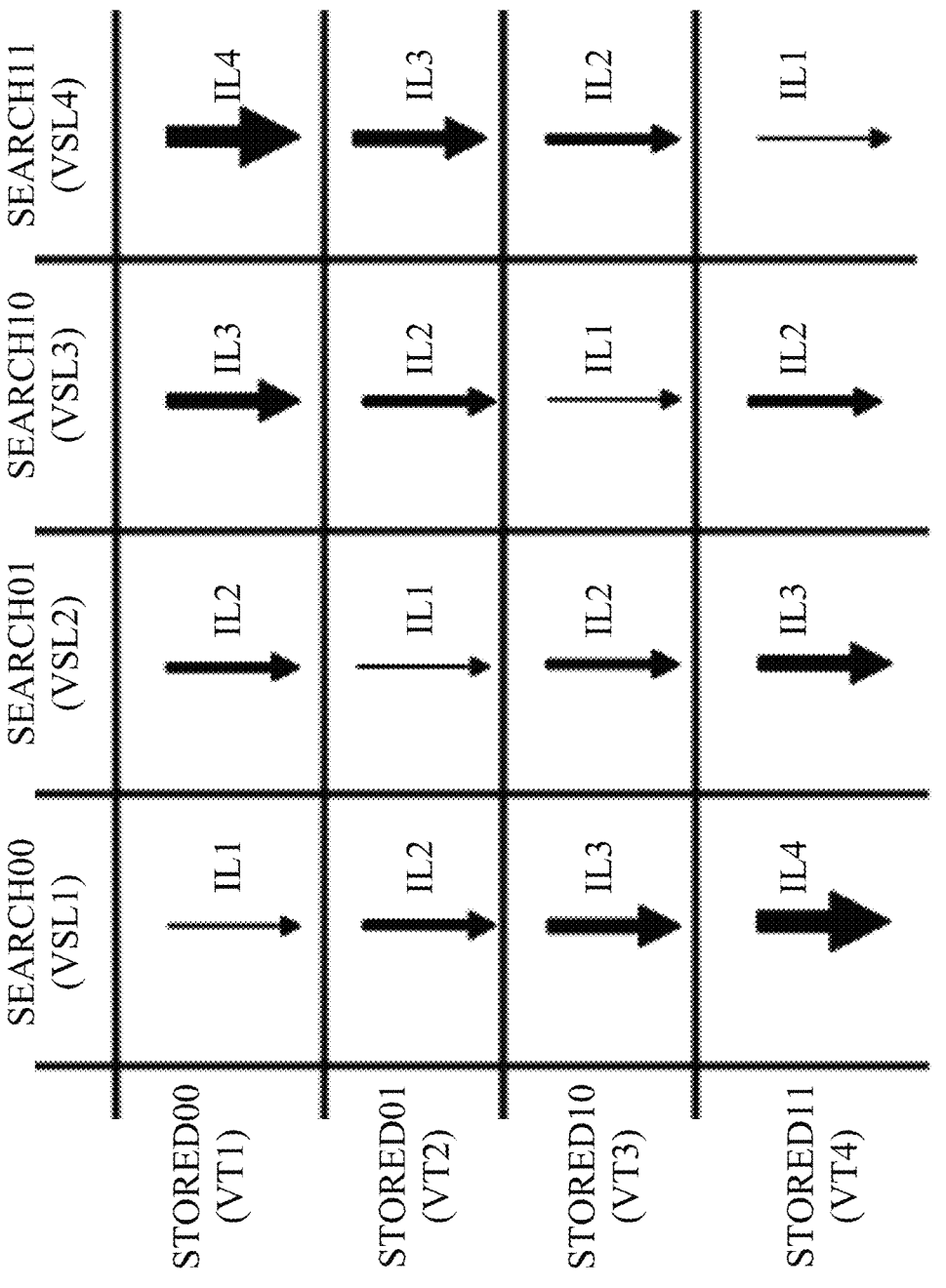
FIG. 4B is a schematic diagram of various conditions of the memory cell performing the search operation, illustrated according to some embodiments of present disclosure.

FIG. 4B is a schematic diagram of various conditions of the memory cell 110 performing the search operation, illustrated according to some embodiments of present disclosure. As shown in FIG. 4B, the memory cell 110 can operate in sixteen conditions. The sixteen conditions are arranged in four columns and four rows.

In the conditions of the first column, the search bit SB1 has the logic value 00, such that the voltage signal VG has the voltage level VSL1. In the conditions of the second column, the search bit SB1 has the logic value 01, such that the voltage signal VG has the voltage level VSL2. In the conditions of the third column, the search bit SB1 has the logic value 10, such that the voltage signal VG has the voltage level VSL3. In the conditions of the fourth column, the search bit SB1 has the logic value 11, such that the voltage signal VG has the voltage level VSL4.

In the conditions of the first row, the data bit DT1 has the logic value 00, such that the memory cell 110 has the threshold voltage level VT1. In the conditions of the second row, the data bit DT1 has the logic value 01, such that the memory cell 110 has the threshold voltage level VT2. In the conditions of the third row, the data bit DT1 has the logic value 10, such that the memory cell 110 has the threshold voltage level VT3. In the conditions of the fourth row, the data bit DT1 has the logic value 11, such that the memory cell 110 has the threshold voltage level VT4.

In some embodiments, the threshold voltage level VT4 is larger than the threshold voltage level VT3, the threshold voltage level VT3 is larger than the threshold voltage level VT2, the threshold voltage level VT2 is larger than the threshold voltage level VT1.

As shown in FIG. 4B, in the conditions of the first column and the first row, of the second column and the second row, of the third column and the third row, of the fourth column and the fourth row, in response to the logic values of the data bit DT1 and the search bit SB1 being the same, the current signal 116 has the current level IL1.

In the conditions of the first column and the second row, of the second column and the first row, of the second column and the third row, of the third column and the second row, of the third column and the fourth row, of the fourth column and the third row, in response to a difference between the logic values of the data bit DT1 and the search bit SB1 being 1 (for example, a difference between the logic values 00 and 01 is 1, and a difference between the logic values 10 and 11 is also 1), the current signal 116 has the current level IL2.

In the conditions of the first column and the third row, of the second column and the fourth row, of the third column and the first row, of the fourth column and the second row, in response to the difference between the logic values of the data bit DT1 and the search bit SB1 being 2 (for example, a difference between the logic values 00 and 10 is 1, and a difference between the logic values 01 and 11 is also 1), the current signal 116 has the current level IL3.

In summary, when a similarity between the data bit DT1 and the search bit SB1 is higher, the current level of the current signal 116 is lower. When the similarity between the data bit DT1 and the search bit SB1 is lower, the current level of the current signal 116 is higher. Correspondingly, the memory device can determine the similarity between the data bit DT1 and the search bit SB1 according to the current level of the current signal 116.

Figure 5A:
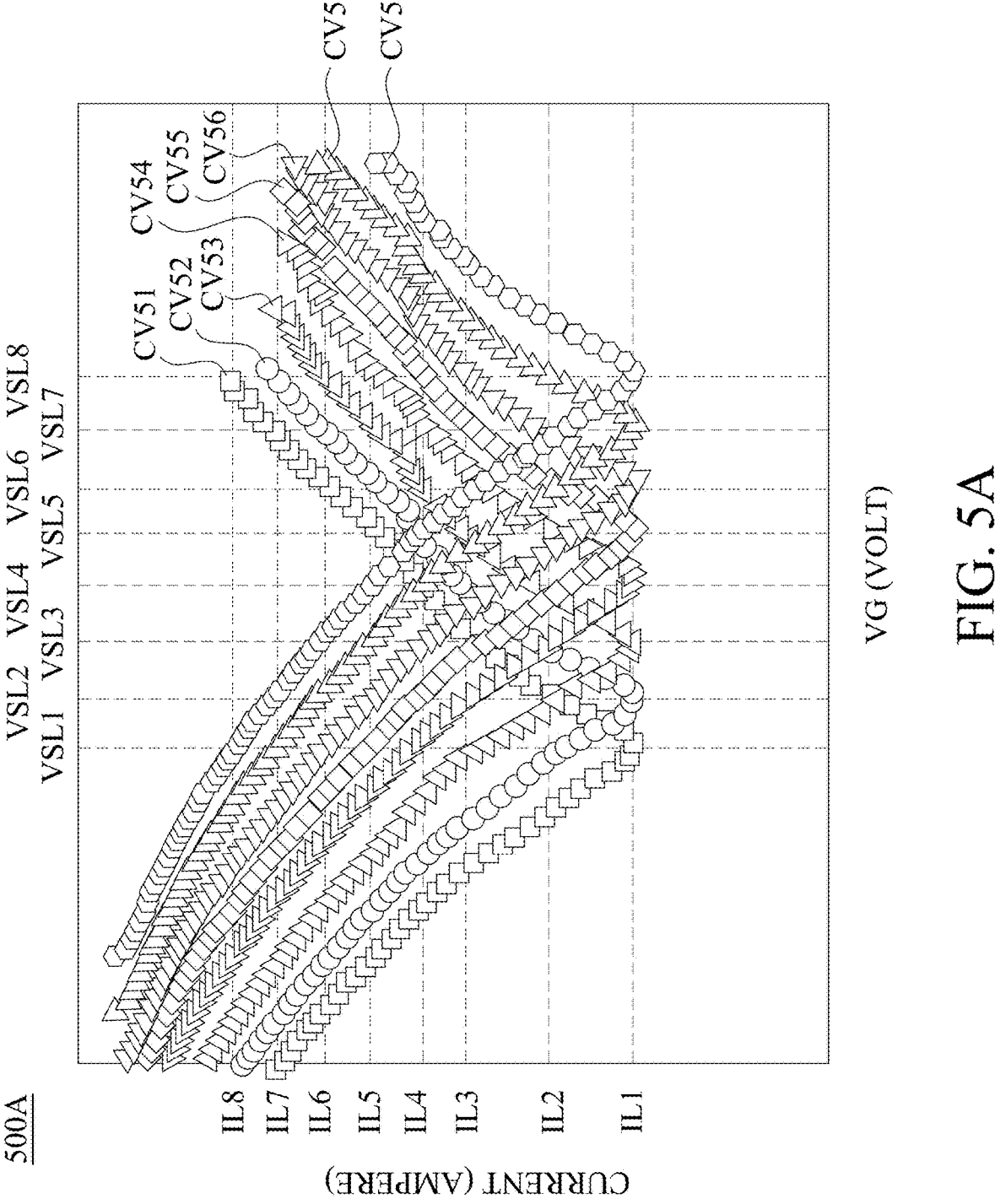
FIG. 5A is a relationship diagram of the current signal and the voltage signal illustrated according to some embodiments of present disclosure.

FIG. 5A is a relationship diagram 500A of the current signal 116 and the voltage signal VG illustrated according to some embodiments of present disclosure. A horizontal axis of the relationship diagram 500A represents voltage levels of the voltage signal VG. A vertical axis of the relationship diagram 500A represents current levels of the current signal 116, and is represented with log scale.

As shown in FIG. 5A, the relationship diagram 500A includes curves CV51-CV58. The curves CV51-CV58 represent eight states of the memory cell 110 corresponding to the current signal 116.

In the state corresponding to the curve CV51, the data bit DT1 stored by the memory cell 110 has the logic value 000. In the state corresponding to the curve CV52, the data bit DT1 stored by the memory cell 110 has the logic value 001. In the state corresponding to the curve CV53, the data bit DT1 stored by the memory cell 110 has the logic value 010. In the state corresponding to the curve CV54, the data bit DT1 stored by the memory cell 110 has the logic value 011. In the state corresponding to the curve CV55, the data bit DT1 stored by the memory cell 110 has the logic value 100. In the state corresponding to the curve CV56, the data bit DT1 stored by the memory cell 110 has the logic value 101. In the state corresponding to the curve CV57, the data bit DT1 stored by the memory cell 110 has the logic value 110. In the state corresponding to the curve CV58, the data bit DT1 stored by the memory cell 110 has the logic value 111. In decimal representation, the logic values 000, 001, 010, 011, 100, 101, 110 and 111 described above correspond to logic values 0, 1, 2, 3, 4, 5, 6 and 7, respectively.

As shown in FIG. 5A, when voltage signal VG has the voltage level VSL1, the curves CV51-CV58 has current levels IL1-IL8, respectively. When voltage signal VG has the voltage level VSL2, the curves CV51-CV58 has current levels IL2, IL1 and IL2-IL7, respectively. When voltage signal VG has the voltage level VSL3, the curves CV51-CV58 has current levels IL3, IL2, IL1 and IL2-IL6, respectively. When voltage signal VG has the voltage level VSL4, the curves CV51-CV58 has current levels IL4, IL3, IL2 and IL1-IL5, respectively. When voltage signal VG has the voltage level VSL5, the curves CV51-CV58 has current levels IL5, IL4, IL3, IL2 and IL1-IL4, respectively. When voltage signal VG has the voltage level VSL6, the curves CV51-CV58 has current levels IL6, IL5, IL4, IL3, IL2 and IL1-IL3, respectively. When voltage signal VG has the voltage level VSL6, the curves CV51-CV58 has current levels IL7, IL6, IL5, IL4, IL3, IL2 and IL1-IL2, respectively. When voltage signal VG has the voltage level VSL6, the curves CV51-CV58 has current levels IL8, IL7, IL6, IL5, IL4, IL3, IL2 and IL1, respectively.

In some embodiments, the current level IL8 is larger than the current level IL7, the current level IL7 is larger than the current level IL6, the current level IL6 is larger than the current level IL5, the current level IL5 is larger than the current level IL4, the current level IL4 is larger than the current level IL3, the current level IL3 is larger than the current level IL2, and the current level IL2 is larger than the current level IL1.

FIG. 5B is a schematic diagram of various conditions of the memory cell 110 performing the search operation, illustrated according to some embodiments of present disclosure. As shown in FIG. 5B, the memory cell 110 can operate in sixty-four conditions. The sixty-four conditions are arranged in eight columns and eight rows.

In the conditions of the first column, the search bit SB1 has the logic value 000, such that the voltage signal VG has the voltage level VSL1. In the conditions of the second column, the search bit SB1 has the logic value 001, such that the voltage signal VG has the voltage level VSL2. In the conditions of the third column, the search bit SB1 has the logic value 010, such that the voltage signal VG has the voltage level VSL3. In the conditions of the fourth column, the search bit SB1 has the logic value 011, such that the voltage signal VG has the voltage level VSL4. In the conditions of the fifth column, the search bit SB1 has the logic value 100, such that the voltage signal VG has the voltage level VSL5. In the conditions of the sixth column, the search bit SB1 has the logic value 101, such that the voltage signal VG has the voltage level VSL6. In the conditions of the seventh column, the search bit SB1 has the logic value 110, such that the voltage signal VG has the voltage level VSL7. In the conditions of the eighth column, the search bit SB1 has the logic value 111, such that the voltage signal VG has the voltage level VSL8.

In the conditions of the first row, the data bit DT1 has the logic value 000, such that the memory cell 110 has the threshold voltage level VT1. In the conditions of the second row, the data bit DT1 has the logic value 001, such that the memory cell 110 has the threshold voltage level VT2. In the conditions of the third row, the data bit DT1 has the logic value 010, such that the memory cell 110 has the threshold voltage level VT3. In the conditions of the fourth row, the data bit DT1 has the logic value 011, such that the memory cell 110 has the threshold voltage level VT4. In the conditions of the fifth row, the data bit DT1 has the logic value 100, such that the memory cell 110 has the threshold voltage level VT5. In the conditions of the sixth row, the data bit DT1 has the logic value 101, such that the memory cell 110 has the threshold voltage level VT6. In the conditions of the seventh row, the data bit DT1 has the logic value 110, such that the memory cell 110 has the threshold voltage level VT7. In the conditions of the eighth row, the data bit DT1 has the logic value 111, such that the memory cell 110 has the threshold voltage level VT8.

In some embodiments, the threshold voltage level VT8 is larger than the threshold voltage level VT7, the threshold voltage level VT7 is larger than the threshold voltage level VT6, the threshold voltage level VT6 is larger than the threshold voltage level VT5, the threshold voltage level VT5 is larger than the threshold voltage level VT4, the threshold voltage level VT4 is larger than the threshold voltage level VT3, the threshold voltage level VT3 is larger than the threshold voltage level VT2, the threshold voltage level VT2 is larger than the threshold voltage level VT1.

As shown in FIG. 5B, in the conditions of the first column and the first row, of the second column and the second row, of the third column and the third row, of the fourth column and the fourth row, of the fifth column and the fifth row, of the sixth column and the sixth row, of the seventh column and the seventh row, of the eighth column and the eighth row, in response to the logic values of the data bit DT1 and the search bit SB1 being the same, the current signal 116 has the current level IL1.

In the conditions of the first column and the second row, of the second column and the first row, of the second column and the third row, of the third column and the second row, of the third column and the fourth row, of the fourth column and the third row, of the fourth column and the fifth row, of the fifth column and the fourth row, of the fifth column and the sixth row, of the sixth column and the fifth row, of the sixth column and the seventh row, of the seventh column and the sixth row, of the seventh column and the eighth row, of the eighth column and the seventh row, in response to a difference between the logic values of the data bit DT1 and the search bit SB1 being 1 (for example, a difference between the logic values 010 and 011 is 1, and a difference between the logic values 110 and 111 is also 1), the current signal 116 has the current level IL2.

In the conditions of the first column and the third row, of the second column and the fourth row, of the third column and the first row, of the third column and the fifth row, of the fourth column and the second row, of the fourth column and the sixth row, of the fifth column and the third row, of the fifth column and the seventh row, of the sixth column and the fourth row, of the sixth column and the eighth row, of the seventh column and the fifth row, of the eighth column and the sixth row, in response to the difference between the logic values of the data bit DT1 and the search bit SB1 being 2 (for example, a difference between the logic values 100 and 010 is 2, and a difference between the logic values 101 and 111 is also 2), the current signal 116 has the current level IL3.

In the conditions of the first column and the fourth row, of the second column and the fifth row, of the third column and the sixth row, of the fourth column and the first row, of the fourth column and the seventh row, of the fifth column and the second row, of the fifth column and the eighth row, of the sixth column and the third row, of the seventh column and the fourth row, of the eighth column and the fifth row, in response to the difference between the logic values of the data bit DT1 and the search bit SB1 being 3 (for example, a difference between the logic values 100 and 001 is 3, and a difference between the logic values 100 and 111 is also 3), the current signal 116 has the current level IL4.

In the conditions of the first column and the fifth row, of the second column and the sixth row, of the third column and the seventh row, of the fourth column and the eighth row, of the fifth column and the second row, of the fifth column and the first row, of the sixth column and the second row, of the seventh column and the third row, of the eighth column and the fourth row, in response to the difference between the logic values of the data bit DT1 and the search bit SB1 being 4 (for example, a difference between the logic values 101 and 001 is 4, and a difference between the logic values 011 and 111 is also 4), the current signal 116 has the current level IL5.

In the conditions of the first column and the sixth row, of the second column and the seventh row, of the third column and the eighth row, of the sixth column and the first row, of the seventh column and the second row, of the eighth column and the third row, in response to the difference between the logic values of the data bit DT1 and the search bit SB1 being 5 (for example, a difference between the logic values 101 and 000 is 5, and a difference between the logic values 010 and 111 is also 5), the current signal 116 has the current level IL6.

In the conditions of the first column and the seventh row, of the second column and the eighth row, of the seventh column and the first row, of the eighth column and the second row, in response to the difference between the logic values of the data bit DT1 and the search bit SB1 being 6 (for example, a difference between the logic values 110 and 000 is 6, and a difference between the logic values 001 and 111 is also 6), the current signal 116 has the current level IL7.

In the conditions of the first column and the seventh row, of the second column and the eighth row, of the seventh column and the first row, of the eighth column and the second row, in response to the difference between the logic values of the data bit DT1 and the search bit SB1 being 6 (for example, a difference between the logic values 110 and 000 is 6, and a difference between the logic values 001 and 111 is also 6), the current signal 116 has the current level IL7.

In the conditions of the first column and the eighth row, of the eighth column and the first row, in response to the difference between the logic values of the data bit DT1 and the search bit SB1 being 7 (for example, a difference between the logic values 111 and 000 is 7), the current signal 116 has the current level IL8.

In summary, for the decimal representation, the data bit DT1 can have one of the logic values 0-7, and the search bit SB1 can also have one of the logic values 0-7. When the search operation is performed, the current level of the current signal 116 is positive correlated with the difference between the data bit DT1 and the search bit SB1. Alternatively stated, the current level of the current signal 116 is negative correlated with the similarity between the data bit DT1 and the search bit SB1.

Specifically, when a similarity between the data bit DT1 and the search bit SB1 is higher, the current level of the current signal 116 is lower. When the similarity between the data bit DT1 and the search bit SB1 is lower, the current level of the current signal 116 is higher. Correspondingly, the memory device can determine the similarity between the data bit DT1 and the search bit SB1 according to the current level of the current signal 116.

Figure 6:
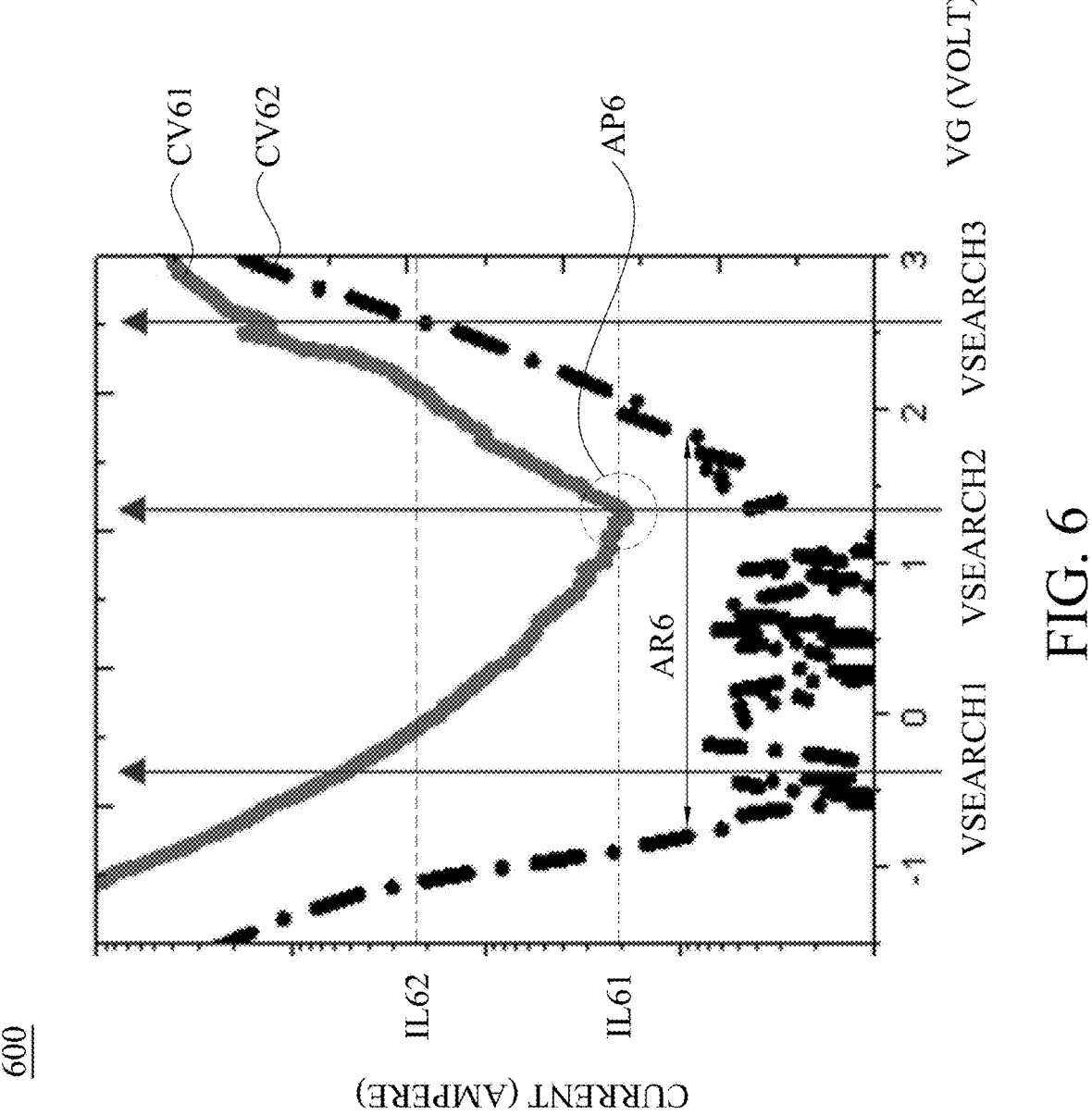
FIG. 6 is a relationship diagram of the current signal and the voltage signal, illustrated according to some embodiments of present disclosure.

FIG. 6 is a relationship diagram 600 of the current signal 116 and the voltage signal VG, illustrated according to some embodiments of present disclosure. A horizontal axis of the relationship diagram 600 represents voltage levels of the voltage signal VG. A vertical axis of the relationship diagram 600 represents current levels of the current signal 116, and is represented with log scale. As shown in FIG. 6, the relationship diagram 600 includes curves CV61-CV62. The data bits DT1 corresponding to the curves CV61-CV62 are the same. The curves CV61-CV62 correspond to two different device lengths, respectively.

Referring to FIG. 6 and FIG. 1, the device length can correspond to a length of the memory cell 110 along the horizontal direction. In some embodiments, the device length can correspond to a length of the channel structure along the horizontal direction, and can also correspond to a distance between the source structure 111 and the drain structure 112. The device length corresponds to the curve CV61 is smaller than the device length corresponds to the curve CV62.

In some embodiments, voltage signals having different pulse widths or different voltage levels can be applied to the memory cell 110, to change the threshold voltage level of the memory cell 110, such that the curves CV61 and CV62 move along the horizontal direction. For example, referring to FIG. 6 and FIG. 5A, the curve CV61 can be adjusted as any of the curves CV51-CV58 by different voltage signals.

As shown in FIG. 6, when the voltage signal VG has a search voltage level VSEARCH1, the current level of the curve CV62 is smaller than the current level IL61, and the current level of the curve CV61 is larger than the current level IL62. When the voltage signal VG has a search voltage level VSEARCH2, the current level of the curve CV62 is smaller than the current level IL61, and the curve CV61 has the current level IL61. When the voltage signal VG has a search voltage level VSEARCH3, the curve CV62 has the current level IL62, and the current level of the curve CV61 is larger than the current level IL62.

In some embodiments, the voltage levels VSEARCH1, VSEARCH2 and VSEARCH3 correspond to three different logic values of the search bit SB1. The current levels larger than or equal to the current level IL62 represent that the search bit SB1 and the data bit DT1 are not match. The current levels smaller than or equal to the current level IL61 represent that the search bit SB1 and the data bit DT1 are match. In some embodiments, the current levels IL61 and IL62 are referred to as a match current level and mismatch current level.

Alternatively stated, for the curve CV61, the logic values of the voltage levels VSEARCH1 and VSEARCH3 and the logic value of the data bit DT1 are mismatch, and the logic value of the search voltage level VSEARCH2 and the logic value of the data bit DT1 are match. For the curve CV62, the logic values of the voltage levels VSEARCH1 and VSEARCH2 and the logic value of the data bit DT1 are match, and the logic value of the search voltage level VSEARCH3 and the logic value of the data bit DT1 are mismatch.

As shown in FIG. 6, the curve CV61 has an analog point AP6 corresponds to the search voltage level VSEARCH2, and the curve CV62 has an analog range AR6 includes the voltage levels VSEARCH2 and VSEARCH1. In some embodiments, the device length of the memory cell 110 can be adjusted to perform range searching or point searching.

Specifically, when the device length of the memory cell 110 corresponds to the curve CV62, the logic values corresponding to the voltage levels within the analog range AR6 are considered as match with the logic value of the data bit DT1. When the device length of the memory cell 110 corresponds to the curve CV61, the logic value corresponding to the search voltage level VSEARCH2 is considered as match with the logic value of the data bit DT1, and the logic value corresponding to the search voltage level VSEARCH1 is considered as mismatch with the logic value of the data bit DT1.

In some embodiments, the match results described above can be determined by relationship between the current signal 116 and the current levels IL61, IL62. For example, when the current level of the current signal 116 is larger than the current level IL62, the search bit SB1 and the data bit DT1 are mismatch. When the current level of the current signal 116 is smaller than the current level IL61, the search bit SB1 and the data bit DT1 are match.

Figure 7A:
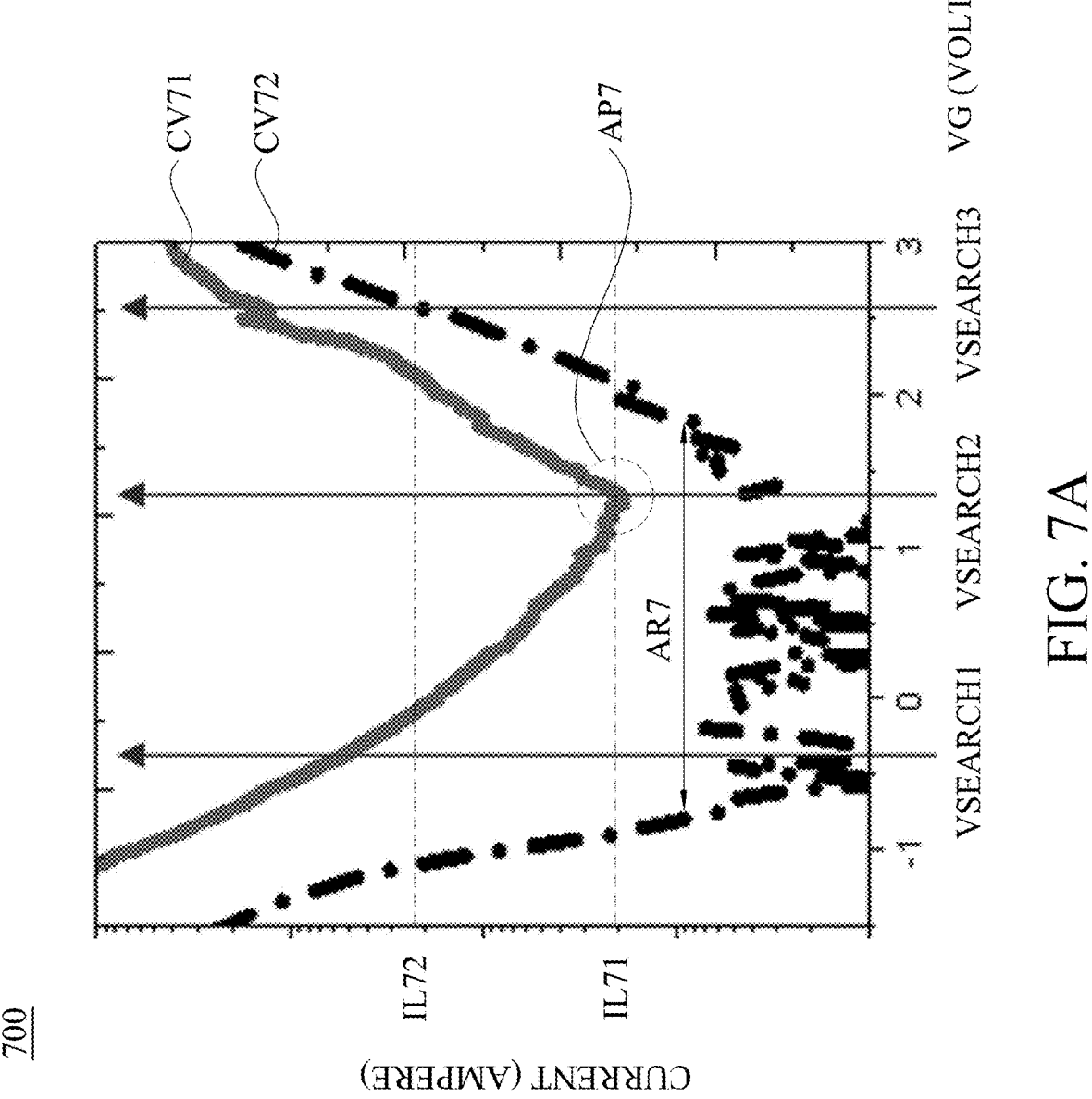
FIG. 7A is a relationship diagram of the current signal and the voltage signal, illustrated according to some embodiments of present disclosure.

FIG. 7A is a relationship diagram 700 of the current signal 116 and the voltage signal VG, illustrated according to some embodiments of present disclosure. A horizontal axis of the relationship diagram 700 represents voltage levels of the voltage signal VG. A vertical axis of the relationship diagram 700 represents current levels of the current signal 116, and is represented with log scale. As shown in FIG. 7A, the relationship diagram 700 includes curves CV71-CV72. The data bits DT1 corresponding to the curves CV71-CV72 are the same. The curves CV71-CV72 correspond to two different drain bias signals, respectively.

Referring to FIG. 7A and FIG. 1, the drain bias signal is a bias signal applied to the drain structure 112. In some embodiments, a drain bias level of the drain bias signal corresponds to the curve CV71 is larger than a drain bias level of the drain bias signal corresponds to the curve CV72.

In some embodiments, voltage signals having different pulse widths or different voltage levels can be applied to the memory cell 110, to change the threshold voltage level of the memory cell 110, such that the curves CV71 and CV72 move along the horizontal direction. For example, referring to FIG. 7A and FIG. 5A, the curve CV71 can be adjusted as any of the curves CV51-CV58 by different voltage signals.

As shown in FIG. 7A, when the voltage signal VG has a search voltage level VSEARCH1, the current level of the curve CV72 is smaller than the current level IL71, and the current level of the curve CV71 is larger than the current level IL72. When the voltage signal VG has a search voltage level VSEARCH2, the current level of the curve CV72 is smaller than the current level IL71, and the curve CV71 has the current level IL71. When the voltage signal VG has a search voltage level VSEARCH3, the curve CV72 has the current level IL72, and the current level of the curve CV71 is larger than the current level IL72.

In some embodiments, the voltage levels VSEARCH1, VSEARCH2 and VSEARCH3 correspond to three different logic values of the search bit SB1. The current levels larger than or equal to the current level IL72 represent that the search bit SB1 and the data bit DT1 are not match. The current levels smaller than or equal to the current level IL71 represent that the search bit SB1 and the data bit DT1 are match. In some embodiments, the current levels IL71 and IL72 are referred to as a match current level and mismatch current level.

Alternatively stated, for the curve CV71, the logic values of the voltage levels VSEARCH1 and VSEARCH3 and the logic value of the data bit DT1 are mismatch, and the logic value of the search voltage level VSEARCH2 and the logic value of the data bit DT1 are match. For the curve CV72, the logic values of the voltage levels VSEARCH1 and VSEARCH2 and the logic value of the data bit DT1 are match, and the logic value of the search voltage level VSEARCH3 and the logic value of the data bit DT1 are mismatch.

As shown in FIG. 7A, the curve CV71 has an analog point AP7 corresponds to the search voltage level VSEARCH2, and the curve CV72 has an analog range AR7 includes the voltage levels VSEARCH2 and VSEARCH1. In some embodiments, the drain bias signal of the memory cell 110 can be adjusted to perform range searching or point searching.

Specifically, when the drain bias signal of the memory cell 110 corresponds to the curve CV72, the logic values corresponding to the voltage levels within the analog range AR7 are considered as match with the logic value of the data bit DT1. When the drain bias signal of the memory cell 110 corresponds to the curve CV71, the logic value corresponding to the search voltage level VSEARCH2 is considered as match with the logic value of the data bit DT1, and the logic value corresponding to the search voltage level VSEARCH1 is considered as mismatch with the logic value of the data bit DT1.

In some embodiments, the match results described above can be determined by relationship between the current signal 116 and the current levels IL71, IL72. For example, when the current level of the current signal 116 is larger than the current level IL72, the search bit SB1 and the data bit DT1 are mismatch. When the current level of the current signal 116 is smaller than the current level IL71, the search bit SB1 and the data bit DT1 are match. Referring to FIG. 6 and FIG. 7A, in some embodiments, the current levels IL71 and IL61 are the same, and the current levels IL72 and IL62 are the same.

Figure 7B:
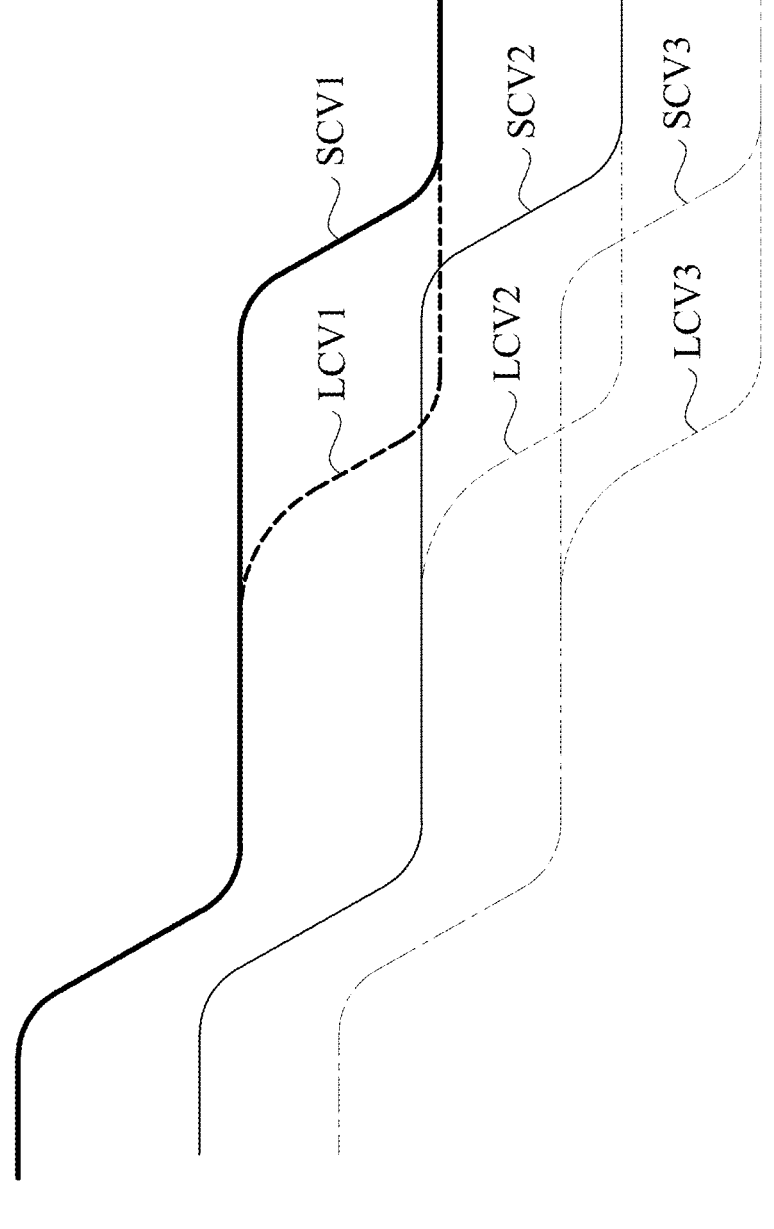
FIG. 7B is a bond schematic diagram of the memory cell corresponding to FIG. 7A, illustrated according to some embodiments of present disclosure.

FIG. 7B is a bond schematic diagram 700B of the memory cell 110 corresponding to FIG. 7A, illustrated according to some embodiments of present disclosure. A horizontal axis of the bond schematic diagram 700B corresponds to electron voltages. A vertical axis of the bond schematic diagram 700B corresponds to a direction from the source structure 111 to the drain structure 112, such as the horizontal direction shown in FIG. 1. In the embodiment shown in FIG. 7B, the voltage level of the voltage signal VG is approximately equal to 0.

As shown in FIG. 7B, the bond schematic diagram 700B includes energy levels SCV1-SCV3 and LCV1-LCV3. The energy levels SCV1 and LCV1 correspond to conductive band. The energy levels SCV2 and LCV2 correspond to Fermi-level. The energy levels SCV3 and LCV3 correspond to valence band.

In some embodiments, the energy levels SCV1-SCV3 correspond to a smaller drain bias signal, and the energy levels LCV1-LCV3 correspond to a larger drain bias signal. Referring to FIG. 7B and FIG. 7A, the energy levels SCV1-SCV3 correspond to the drain bias signal of the curve CV72, and are configured to form a longer equivalent device length. The energy levels LCV1-LCV3 correspond to the drain bias signal of the curve CV71, and are configured to form a shorter equivalent device length.

Alternatively stated, when the drain bias signal is adjusted from the drain bias level corresponding to the curve CV72 to the drain bias level corresponding to the curve CV71, the memory cell 110 is shifted from the energy levels SCV1-SCV3 to the energy levels LCV1-LCV3. When the drain bias signal is adjusted from the drain bias level corresponding to the curve CV71 to the drain bias level corresponding to the curve CV72, the memory cell 110 is shifted from the energy levels LCV1-LCV3 to the energy levels SCV1-SCV3. In some embodiments, the equivalent device length of the memory cell 110 can be changed by adjusting the drain bias signal of the memory cell 110, to perform range searching or point searching.

Figure 8:
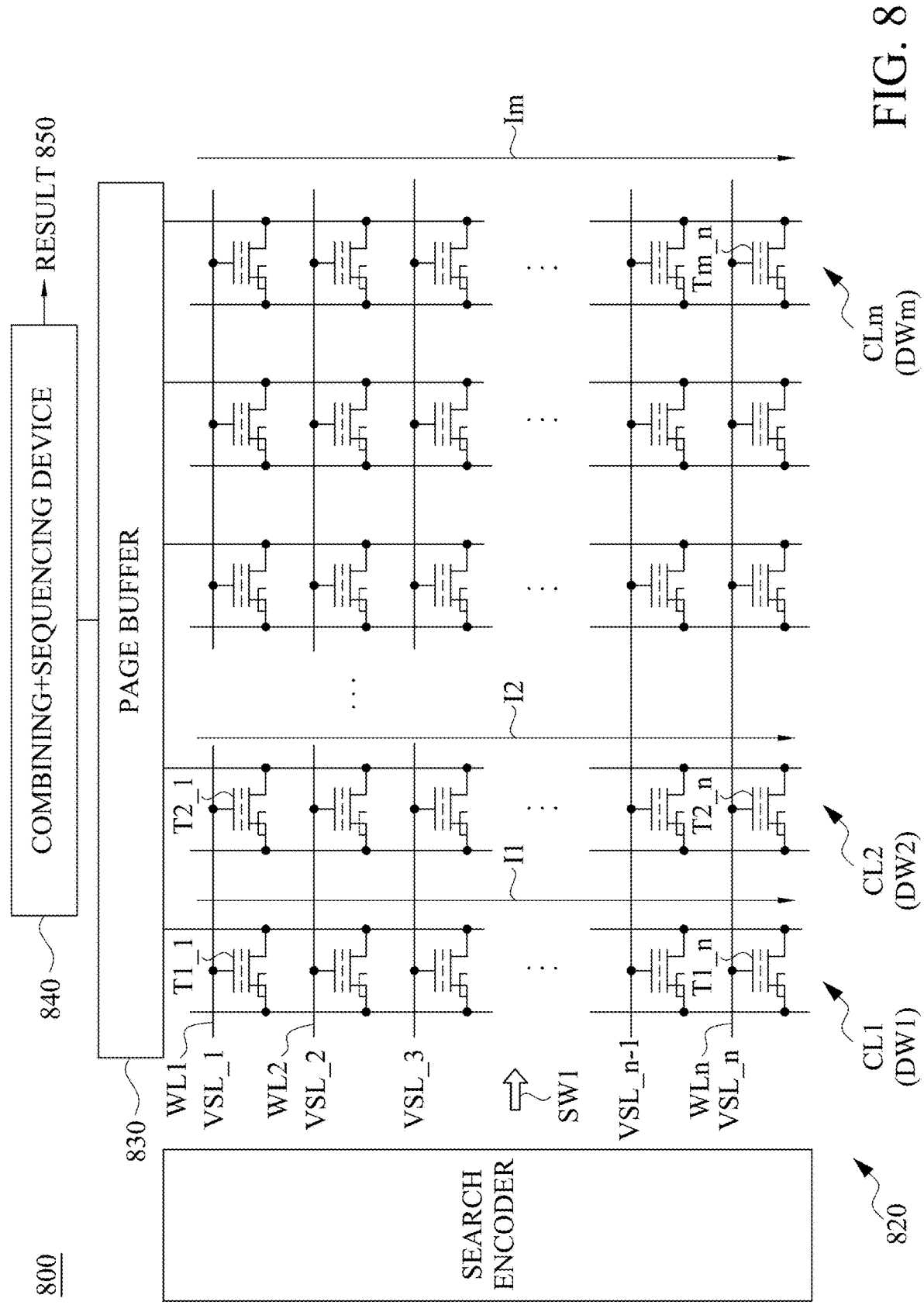
FIG. 8 is a schematic diagram of a memory system, illustrated according to some embodiments of present disclosure.

FIG. 8 is a schematic diagram of a memory system 800, illustrated according to some embodiments of present disclosure. In some embodiments, the memory system 800 can be implemented by TFET in-memory search system.

As shown in FIG. 8, the memory system 800 includes a search encoder 810, a memory array 820, a page buffer 830 and a combining/sequencing device 840. The search encoder 810 is configured to generate word line signals WL1-WLn carrying a search word SW1. The memory array 820 includes memory columns CL1-CLm. The memory columns CL1-CLm are configured to store data words DW1-DWm, respectively, and generate current signals I1-Im according to the search word SW1 and the data words DW1-DWm. The page buffer 830 is configured to receive the current signals I1-Im, and output to the combining/sequencing device 840. The combining/sequencing device 840 is configured to process the output of the page buffer 830 to generate the searching result 850. In some embodiments, the page buffer 830 can include multiple sensing amplifiers (SA).

In some embodiments, the process performed by the combining/sequencing device 840 to the output of the page buffer 830 includes logic processes of AND logic, OR logic or counting, and also may include combining processes of the three logic processes described above. Referring to FIG. 1 and FIG. 8, the combining/sequencing device 840 can receive sense results from the memory device 100 and/or the memory array 820, and controls sequencing (whether serial or parallel) and combines sense results to produce overall search results as the search results 850.

In some embodiments, the memory system 800 can be implemented on a single integrated circuit die, multiple integrated circuits, or be implemented as a component of a system-on-a-chip (SOC). As a specific example, the memory system 800 is implemented on a single integrated circuit die, and can perform searching and combining logic operations in the single integrated circuit die.

As shown in FIG. 8, the memory column CL1 includes transistors T1_1-T1_n. The memory column CL2 includes transistors T2_1-T2_n, and so on. The memory column CLm includes transistors Tm_1-Tm_n. Source terminals of the transistors T1_1-T1_n are coupled to each other. Source terminals of the transistors T2_1-T2_n are coupled to each other, and so on. Source terminals of the transistors Tm_1-Tm_n are coupled to each other. Drain terminals of the transistors T1_1-T1_n are coupled to each other and are configured to output the current signal I1. Drain terminals of the transistors T2_1-T2_n are coupled to each other and are configured to output the current signal I2, and so on. Drain terminals of the transistors Tm_1-Tm_n are coupled to each other and are configured to output the current signal Im.

On the other hand, gate terminals of the transistors T1_1-Tm_1 are configured to receive the word line signal WL1. Gate terminals of the transistors T1_2-Tm_2 are configured to receive the word line signal WL2, and so on. Gate terminals of the transistors T1_n-Tm_n are configured to receive the word line signal WLn.

Referring to FIG. 8 and FIG. 1, the memory array 820 can be implemented by the memory device 100. Each of the transistors T1_1-Tm_n can be implemented by the memory cell 110, and is configured to store one corresponding data bit in the data words DW1-DWm. Each of the word line signals WL1-WLn corresponds to the voltage signal VG, and is configured to carry one corresponding search bit in the search word SW1.

In some embodiments, the word line signals WL1-WLn has voltage levels VSL_1-VSL_n, respectively. In some embodiments, each of the voltage levels VSL_1-VSL_n can be any of the voltage levels VSL1-VSL8, to carry the corresponding logic value.

During the search operation, the transistors T1_1-T1_n compares the search word SW1 and the data word DW1, generates corresponding current signals 116, and sums the current signals 116 to generate the current signal I1. Similarly, the transistors T2_1-T2_n compares the search word SW1 and the data word DW2, generates corresponding current signals 116, and sums the current signals 116 to generate the current signal I2, and so on. The transistors Tm_1-Tm_n compares the search word SW1 and the data word DWm, generates corresponding current signals 116, and sums the current signals 116 to generate the current signal Im.

When a similarity of the search word SW1 and one of the data words DW1-DWm is higher, a corresponding one of the current signals I1-Im is lower. When the similarity of the search word SW1 and the one of the data words DW1-DWm is lower, the corresponding one of the current signals I1-Im is higher. Correspondingly, the memory system 800 can determine the similarities of the search word SW1 and the data words DW1-DWm.

For example, in some embodiments, a current level of the current signal Im is larger than a current level of the current signal I2, and a current level of the current signal I2 is larger than a current level of the current signal I1. In the embodiments described above, the memory system 800 can determine that the similarity between the search word SW1 and the data word DW1 is larger than the similarity between the search word SW1 and the data word DW2, and the similarity between the search word SW1 and the data word DW2 is larger than the similarity between the search word SW1 and the data word DWm.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising a first memory cell configured to store a first data bit, the first memory cell comprising:
a channel structure;
a source structure contacting a first side of the channel structure;
a drain structure contacting a second side of the channel structure; and
a charge trap layer contacting a third side of the channel structure,
wherein when the first data bit has a first logic value and a voltage signal applied to the charge trap layer has a first voltage level, a current signal flowing through the channel structure has a first current level,
when the first data bit has the first logic value and the voltage signal has a second voltage level different from the first voltage level, the current signal has a second current level different from the first current level,
when the first data bit has a second logic value different from the first logic value and the voltage signal has the first voltage level, the current signal has the second current level, and
when the first data bit has the second logic value and the voltage signal has the second voltage level, the current signal has the first current level.

2. The memory device of claim 1, further comprising:
a top electrode configured to apply the voltage signal to the charge trap layer,
wherein along a first direction, the charge trap layer is located between the top electrode and the channel structure.

3. The memory device of claim 2, wherein along a second direction perpendicular with the first direction, the first side is opposite to the second side.

4. The memory device of claim 1, wherein
when the channel structure has a first device length, in response to the voltage signal having a first search voltage level, a current level of the current signal is larger than a mismatch current level,
when the channel structure has a second device length, in response to the voltage signal having the first search voltage level, the current level of the current signal is smaller than a match current level,
the first device length is smaller than the second device length, and
the match current level is smaller than mismatch current level.

5. The memory device of claim 4, wherein
when the channel structure has the first device length, in response to the voltage signal having a second search voltage level, the current level of the current signal is equal to the match current level, and
when the channel structure has the second device length, in response to the voltage signal having the second search voltage level, the current level of the current signal is smaller than the match current level.

6. The memory device of claim 5, wherein
when the channel structure has the first device length, in response to the voltage signal having a third search voltage level, the current level of the current signal is larger than to the mismatch current level, and
when the channel structure has the second device length, in response to the voltage signal having the third search voltage level, the current level of the current signal is equal to the mismatch current level.

7. The memory device of claim 1, wherein
when a drain bias signal applied to the drain structure has a first drain bias level, in response to the voltage signal having a first search voltage level, a current level of the current signal is larger than a mismatch current level,
when the drain bias signal has a second drain bias level, in response to the voltage signal having the first search voltage level, the current level of the current signal is smaller than a match current level,
the first drain bias level is smaller than the second drain bias level, and
the match current level is smaller than mismatch current level.

8. The memory device of claim 7, wherein
when the drain bias signal has the first drain bias level, in response to the voltage signal having a second search voltage level, the current level of the current signal is equal to the match current level, and
when the drain bias signal has the second drain bias level, in response to the voltage signal having the second search voltage level, the current level of the current signal is smaller than the match current level.

9. The memory device of claim 8, wherein
when the drain bias signal has the first drain bias level, in response to the voltage signal having a third search voltage level, the current level of the current signal is larger than to the mismatch current level, and
when the drain bias signal has the second drain bias level, in response to the voltage signal having the third search voltage level, the current level of the current signal is equal to the mismatch current level.

10. An operating method of a memory device, comprising:

storing a first data bit in a first memory cell;

applying a voltage signal carrying a first search bit to the first memory cell; and comparing first data bit and the first search bit to generate a current signal flowing through the first memory cell, wherein when each of the first data bit and the first search bit has a first logic value, the current signal has a first current level, when the first data bit has the first logic value and the first search bit has a second logic value, the current signal has a second current level larger than the first current level, when the first data bit has the first logic value and the first search bit has a third logic value different from the second logic value, the current signal has the second current level, and a difference between the first logic value and the second logic value is equal to a difference between the third logic value and the first logic value.

11. The operating method of claim 10, wherein when the first data bit has the second logic value and the first search bit has the second logic value, the current signal has the first current level.

12. The operating method of claim 11, wherein when the first data bit has the third logic value and the first search bit has the third logic value, the current signal has the first current level.

13. The operating method of claim 10, wherein when the first data bit has the second logic value and the first search bit has the third logic value, the current signal has a third current level larger than the second current level.

14. The operating method of claim 13, wherein when the first data bit has the third logic value and the first search bit has the second logic value, the current signal has the third current level.

15. The operating method of claim 13, wherein when the first data bit has a fourth logic value and the first search bit has the second logic value, the current signal has a fourth current level larger than the third current level, and the fourth logic value is larger than the third logic value.

16. The operating method of claim 15, wherein when the first data bit has the second logic value and the first search bit has the fourth logic value, the current signal has the fourth current level.

17. The operating method of claim 15, wherein when the first data bit has the fourth logic value and the first search bit has the fourth logic value, the current signal has the first current level.

18. An operating method of a memory device, comprising:

setting a first threshold voltage of a first memory cell to store a first data bit in the first memory cell;

applying a voltage signal carrying a first search bit to the first memory cell; and generating a current signal according to the first search bit and the first threshold voltage, wherein the first data bit has a first logic value when the first threshold voltage has a first threshold voltage level, the first data bit has a second logic value different from the first logic value when the first threshold voltage has a second threshold voltage level, when each of the first data bit and the first search bit has the first logic value, the current signal has a first current level, when the first data bit has the second logic value and the first search bit has the first logic value the current signal has a second current level larger than the first current level, and when the first threshold voltage has a third threshold voltage level between the first threshold voltage level and the second threshold voltage level, the current signal has the first current level.

19. The operating method of claim 18, wherein when each of the first data bit and the first search bit has the second logic value, the current signal has the first current level.

20. The operating method of claim 19, wherein when the first data bit has the first logic value and the first search bit has the second logic value, the current signal has the second current level.

* * * * *